United States Patent [19]

Grudkowski

[11] 4,207,546

[45] Jun. 10, 1980

[54] PHASE AND AMPLITUDE PROGRAMMABLE INTERNAL MIXING SAW SIGNAL PROCESSOR

[75] Inventor: Thomas W. Grudkowski, Glastonbury, Conn.

[73] Assignee: United Technologies Corporation, Hartford, Conn.

[21] Appl. No.: 967,323

[22] Filed: Dec. 7, 1978

[51] Int. Cl.² .......................... H03H 7/8; H03H 9/26; H03H 9/30; H01L 27/20

[52] U.S. Cl. .................................... 333/152; 333/166; 333/196; 357/26; 364/821

[58] Field of Search ................................ 333/150-155, 333/193-196, 166; 357/26, 24, 41; 364/821, 824, 862; 332/26; 331/107 A; 330/5.5; 310/313

[56] References Cited

U.S. PATENT DOCUMENTS

| | | | |
|---|---|---|---|
| 3,903,406 | 9/1975 | London | 364/821 |
| 4,065,736 | 12/1977 | London | 357/26 X |
| 4,129,798 | 12/1978 | Defranould | 310/313 |

*Primary Examiner*—Alfred E. Smith
*Assistant Examiner*—Marvin Nussbaum
*Attorney, Agent, or Firm*—M. P. Williams

[57] ABSTRACT

A SAW signal processor includes a plurality of FET taps having individually programmable source-drain bias which controls both the amplitude and the phase of the mixing efficiency of internal product mixing of waves passing beneath the tap, in dependence upon the amplitude and polarity of the bias, the gates of the FETs may be interconnected so as to provide a summation of correlation at the output. Embodiments include multi-FET taps formed on substrates that are both semiconductive and piezoelectric, such as n-type epitaxial gallium aresenide, and ZnO coated silicon. Simple biphase and weighted biphase of phase-shifted tap pairs, for complete phase control, are disclosed.

3 Claims, 7 Drawing Figures

PHASE AND AMPLITUDE PROGRAMMABLE INTERNAL MIXING SAW SIGNAL PROCESSOR

BACKGROUND OF THE INVENTION

1. Field of Art

This invention relates to surface acoustic wave signal processing, and more particularly to a surface acoustic wave signal processor having individual FET taps, separately programmable to provide product mixing beneath each tap in which the mixer efficiency is controllable in amplitude and in phase.

2. Description of the Prior Art

Surface acoustic wave (SAW) signal processing is well known, and may be employed to perform a variety of signal combining/comparing functions, some of which are described in Reeder and Gilden U.S. Pat. No. 4,016,514. These include correlation, convolution, time inversion, and the like. When the SAW signal processors include programmability of the taps, to provide a phase and amplitude programmable, general transverse filter, as in Reeder and Grudkowski U.S. Pat. No. 4,024,480. additional functions, such as programmable correlation, multiplexing and the like may be performed. Programmable taps may be used in conjunction with other SAW device parameters to provide still additional functions, such as discrete Fourier transformation, as disclosed in Reeder U.S. Pat. No. 4,114,116.

The problem with the apparatus described hereinbefore is that a significant amount of per-tap hardware (such as output diode pair structures) must be associated and interconnected with the SAW structure. This is because the operational characteristics employ nonlinear product mixing which is achieved in external devices, and the programming thereof is generated in and applied to external circuitry as well. In the aforementioned devices, the SAW structure itself serves merely to linearly mix the signals with each other, and as such only provides the transversal relationship involved in the process. In order to reduce size, cost and weight, as well as spurious effects in signal conduction, it is desirable to provide SAW signal processors in a more integrated fashion, successful monolithic structures being, of course, ideal.

In the past, attempts have been made to provide direct biphase control in SAW signal processing. For instance, the oldest form of phase programming has been the simple selection of interdigital tap fingers by external circuitry, as described in: Hunsinger, B. J., et al, Programmable Surface-Wave Tapped Delay Line, IEEE Transactions on Sonics and Ultrasonics, Vol. SU-18, No. 3, July 1971, pp. 152–154; and in Moore et al U.S. Pat. No. 3,942,135.

Subsequently, field effect transistors (FETs) were turned to as having potential for more control in surface acoustic wave devices. Examples are described by Claiborne, L. P., et al, MOSFET Ultrasonic Surface-Wave Detectors For Programmable Matched Filters, Applied Physics Letters, Vol. 19, No. 3, Aug. 1, 1971, pp 58–60, by Hickernell, F., et al, An Integrated ZnO/Si-MOSFET Programmable Matched Filter, IEEE 1975 Ultrasonics Symposium Proceedings, pp 223–226, and by Hickernell, F. S., et al, Design and Performance of a ZnO/Si-MOSFET Monolithic Quadriphase Programmable Correlator, 1973 IEEE Ultrasonics Symposium Proceedings, pp 324–327. However, each of these cases is confined to use of amplitude control, generally by means of gate bias, to completely transfer each FET tap between the on and off states, for the purpose of selecting the taps physically located at a correct phase point for phase programming. In early devices of this type, emphasis was placed on using a semiconductor substrate, such as silicon, in order to facilitate fabrication of electronic devices on the substrate for circuit integration enhancement.

More recently, the utilization of a semi-insulating gallium arsenide substrate having a semiconducting epitaxial layer for the formation of FETs directly on a piezoelectric SAW device, has been investigated in a variety of ways. Examples are presented in Staples, E. J., et al, A Review of Device Technology For Programmable Surface-Wave Filters, IEEE Transactions on Microwave Theory and Techniques, Vol. MTT-21, No. 4, April 1973, pp 279–287, in Bruun, M., et al, Field Effect Transistors on Epitaxial GaAs as Transducers for Acoustic Surface Waves, Applied Physics Letters, Vol. 18, No. 4, Feb. 1971, pp 118–120, and in Bruun, M., Electronic Properties of Gallium-Arsenide Field-Effect-Transistor Structure Used as Detector for Waves, Electronics Letters, Vol. 8, No. 8, April 1972, pp 215, 216. In the devices reported therein, amplitude control is, of course, possible but phase is selectable only by on/off control of FET taps at selected phase points on the substrate surface.

The use of internal, nonlinear product mixing, as a mechanism for providing versatility in SAW signal processors has also been known. In Davis, K. L., Zinc Oxide-On-Silicon Programmable Tapped Correlator, IEEE Ultrasonic Symposium Proceedings, pp 456–458, there is disclosed a SAW processor employing interdigital electrode taps, each phase-half of which is separately biasable with respect to a grounded silicon substrate to control mixing efficiency amplitude with respect to such phase-half, which in turn designates the phase of the mixer product, due to reversal of the roles of the interdigital tap finger elements from ground/signal to signal/ground. In this sense, the mixing device reported by Davis is programmable only in the same fashion as the earliest tap element switching devices (which did not respond to the results of nonlinear product mixing, but simply wave addition in the substrate).

A FET GaAs Convolver utilizing non-programmed mixing is described briefly in Spierman, A. O. W., Acoustic-Surface-Wave Convolver on Epitaxial Gallium Arsenide, Electronics Letters, Vol. 11, Nos. 25/26, Dec. 1975, pp 614, 615.

Despite the plethora of suggestions for improved devices, and particularly for programmable devices which may be implemented using integrated circuit techniques for nearly-monolithic strutures, there has been an equal dirth of success therein.

SUMMARY OF THE INVENTION

Objects of the present invention include improved surface acoustic wave signal processors employing internal mixing in which the mixing efficiency is fully programmable in amplitude and in phase.

According to the present invention, a SAW signal processor employs a plurality of taps, each comprising at least one field effect transistor, the source-drain bias of which is controlled to provide nonlinear product mixing of waves beneath the tap in which the mixer efficiency is controllable in phase and amplitude by the polarity and magnitude of the source-drain bias for the respective tap. In accordance with the invention, pairs of taps having a specific transversal phase relationship may be summed, the biphase selection and amplitude weighting of the pairs being effective to permit the summed output to any desired phase (rather than simple biphase). According to the invention, the gates of the plurality of taps may be independent or they may be interconnected, such as for summing of the individual tap responses.

The present invention provides an entirely new dimension in SAW signal processors in that it provides for the creation of nonlinear product mixing individually within each tap, the mixer efficiency of which is controllable in phase as well as in amplitude. The invention may be used for programmable signal correlation, phase equalizing, notch filtering, sidelobe reduction, discrete Fourier transformation, controlled multiplexing, signal generation, time inversion, and a variety of other purposes concerning which the use of SAW signal processors are known. The invention permits utilization of integrated circuit technology not only in the fabrication of the programmable, internally mixed SAW signal processor of the invention, but also in auxiliary circuitry (such as bias control) which may be fabricated on the same substrate in many instances. The invention provides the capability for SAW signal processor design in which reflections, spurious signal generation, need for external filtering, and bandwidth are all vastly reduced since the component result of product mixing can be carefully selected, and the desired unwanted component exists only locally beneath each tap, and is therefore fully isolated from other taps. Due to the fact that biphase control is provided at a single tap element, the invention eliminates the need for redundant, alternatively-selected tap fingers, thereby easing fabrication restraints and reducing size, weight and cost. When associated in phase-shifted pairs, biphase selection and amplitude weighting of summed pair outputs provides full phase control of the effective mixer efficiency of the pair. The invention may be practiced with a minimum of external circuitry, such as coupling capacitors, isolation networks, amplifiers and the like due to its inherent signal quality and tap isolation characteristics.

The foregoing and other objects, features and advantages of the present invention will become more apparent in the light of the following detailed description of exemplary embodiments thereof, as illustrated in the accompanying drawing.

DETAILED DESCRIPTION

Figure 1:
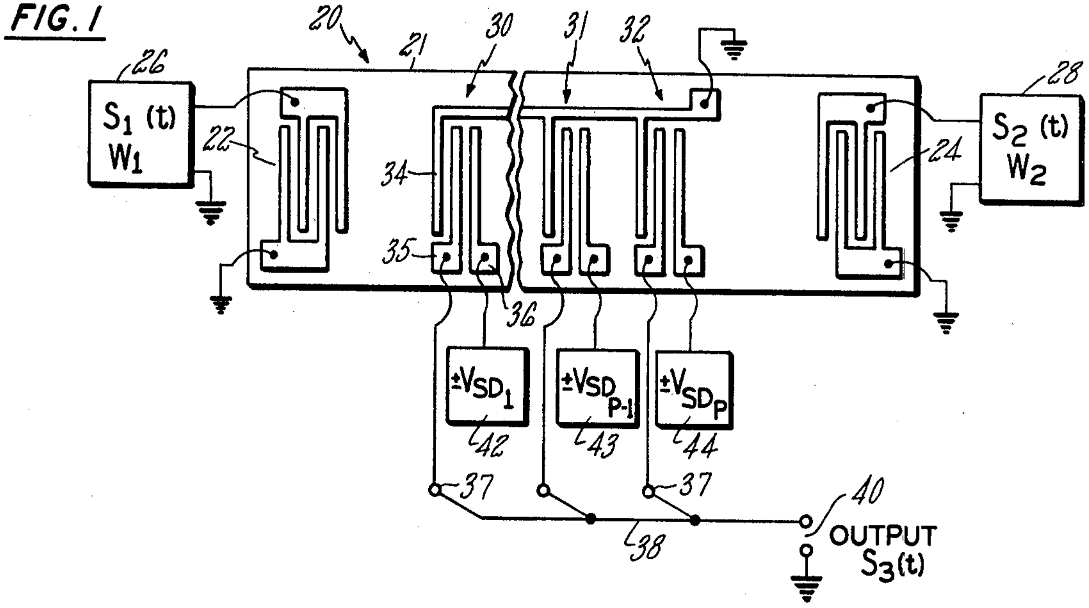
FIG. 1 is a simplified plan view of a SAW signal processor in accordance with the present invention.

Referring now to the drawing, an exemplary, generalized embodiment of the invention is illustrated in simplified form in FIG. 1. Therein, a SAW processor 20 includes a suitable piezoelectric substrate 21 such as gallium arsenide, having a major surface with suitable conductive circuit elements disposed thereon so as to provide a pair of piezoelectric transducers 22, 24 for launching waves in response to respective sources 26, 28 which may correspond to a biphase coded or biphase and amplitude coded signal varying as a function of time at a first frequency and a carrier signal varying as a function of time at a second frequency. The substrate 21 also has a plurality of taps formed on the surface thereof between the two transducers 22, 24. Each of the taps comprises a field effect transducer including a source 34, a gate 35 and a drain 36. The source 34 of each of the transistors is interconnected by suitable metallization with the sources of the other taps 31, 32. And the gate 35 of each of the taps 30 is connected at terminals 37 by a suitable circuit 38 with the gates of the other taps 31, 32 for connection with an output port 40, so as to provide the components of programmed nonlinear product mixing, as is described more fully hereinafter. The taps are commonly spaced equally; but they could have varied spacings, if desired, to suit a particular utilization.

The SAW signal processor 20 may be provided in accordance with the teachings generally known in the art. For instance, the substrate may be semi-insulating gallium arsenide with an n-type epitaxial layer, or doped (e.g., as with chrome) conductivity enhancement at the major surface on which the transducers and taps are disposed. Or, the substrate may be silicon, with a ZnO layer over the fabricated taps. The metallization that forms the transducers 22, 24 and that forms the source and drain fingers 35, 36 preferably provide a highly ohmic contact with the substrate surface, and may be formed by thin films (e.g., about 2000 Angstroms) of gold-germanium alloy, as is known in the art; or, thinner films of material having better acoustic properties than gold (e.g., about 100 Angstroms of aluminum-germanium alloy) may be used if the contact region is first treated to enhance conductivity, such as by ion implantation or epitaxial growth of $n^+$-type material. Combinations of these and other techniques may be used to reduce perturbations at the ohmic contacts with the substrate. On the other hand, the gate fingers 35 should provide rectifying junctions such as Schottky barriers with respect to the surface of the substrate 21, formed of thin films of aluminum, or P-N junctions formed by diffusion or ion implantation.

Reduction of insertion losses and enhancement of other characteristics of the device may be achieved by means of techniques known in the art in the design and fabrication thereof. For instance, launching of the waves with transducers 22, 24 of reduced size may be enhanced if the transducer electrodes are formed on a layer of zinc oxide which in turn is separated from the gallium arsenide substrate in part by a gold film overlaying a silicon dioxide film, with tapering toward the center of the substrate. The technique is known and is illustrated in Quate and Grudkowski U.S. Pat. No. 3,935,564. Also, undesirable conduction between bonding pads, and other spurious effects, may be reduced by etching away the semiconductive material outside of the tap areas.

Programmable tap control is provided by individual source-drain bias sources 42–44 respectively corresponding to each of the taps. Each of these sources is controllable from zero to maximum bias in either of two polarities (plus or minus) to provide full biphase and amplitude programming of the SAW processor so as to form a transversal filter programmable both in amplitude and in phase, directly within the device itself. These sources may be of the general type illustrated in FIG. 3 of Reeder and Grudkowski U.S. Pat. No. 4,024,480, or any other sources, capable of providing suitable transistor source-drain bias, and programmable either in amplitude or in polarity, or both, depending upon the particular implementation of the present invention.

Figure 2:
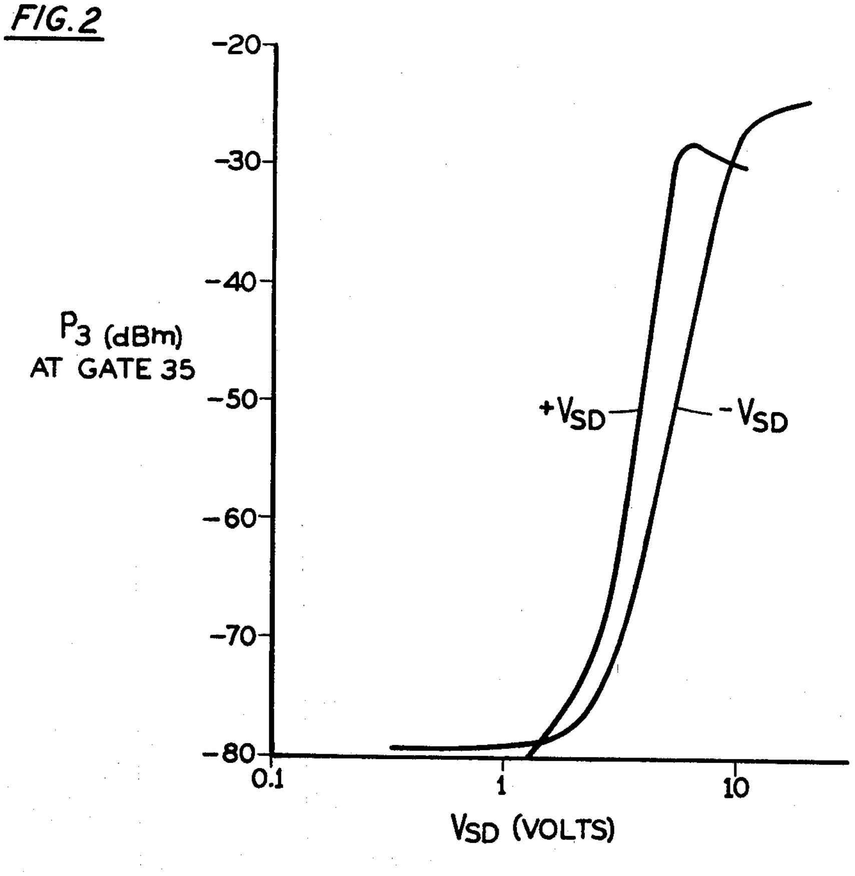
FIG. 2 is an illustration of bias control over mixer efficiency in the invention.

According to the invention, a SAW signal processor employing FET tap structures has, with respect to a pair of waves propagating at the surface of the substrate, a product mixing capability which is directly dependent upon the polarity and magnitude of source-drain bias, within limits of the tap structure and other parameters. Specifically, the mixer efficiency with respect to product mixing of two surface waves in the substrate is controllable in amplitude in a fashion illustrated with respect to one example in FIG. 2. Therein, it is seen that there is an ON/OFF ratio of about 50 dB for the product mixing result (at the output 40, FIG. 1) as the source-drain bias voltage is varied from about 1 volt to on the order of 6 or 10 volts. Additionally, the phase of the product mixing result (at the sum or difference frequency) is dependent upon the polarity of the source-drain bias, for a single tap. Although the phenomenon is extremely complex, and an analysis thereof is not given herein, the amplitude program control illustrated in FIG. 2, and the capability to control the phase of the terms achieved by direct control over the phase of internal product mixing, are illustrative of the fact that there is a mixing effect beneath each tap which is fully programmable in amplitude and in phase. The conversion efficiency is dependent, inter alia, upon the number of FETs at each tap in the interaction region, as is described more fully hereinafter. The bias power drain per FET for biasing of the taps may vary from 0.3 mW to 3 mW over a 50 dB output control range. This is, of course, dependent upon the particular configuration in which the present invention is embodied, as is described more fully hereinafter.

For any wave propagating in the medium, there is an angular frequency, $\omega$, relating to its oscillatory frequency by $\omega=2\pi f$. Depending upon the medium in which the wave is propagating, it also has what is generally referred to as either a phase constant, a wave number, or a wavevector, k, representative of the phase change of the wave, at any instant in time, per unit distance along the direction of propagation. The wavevector k is dependent upon the characteristics of the medium and is defined by the velocity of the wave in that medium, as $k=\omega/V$. In surface acoustic waves propagating in an acousto-electric material, the same holds true. The angular frequency of the strain wave, $\omega$, is a faithful reproduction of the electric frequency applied to the acousto-electrical transducers to induce the strain wave representative thereof. The propagation of the strain wave, however, is at a velocity, V, determined by the material itself. And, the wavevector, k, is that which relates the phase change per unit distance to the temporal change as a function of the inherent velocity of the strain wave, as determined by the parameters of the acousto-electric material in which the wave is propagating.

For product mixing of the type obtainable in accordance with the present invention, there must be a significant nonlinear parameter related to the mixed waves. In this case, since the mixer efficiency is fully controllable from essentially zero to a gain of on the order of 40 dB above noise, as a function of the source-drain bias applied externally to the taps, it is apparent that the significant mixing efficiency achieved is due to interaction between the electric field established under each tap and the parameters of the acoustic waves propagating under the tap. As is discussed more fully hereinafter, for the purpose of the following analysis it is immaterial whether the interaction be between the tap electric field and the electric field linearly related to each of the waves beneath the tap, or other factors related thereto, such as current density, including carrier concentration, mobility, electric field and the like. However, verification of the effect is obtainable through analysis of the phenomenon which must be apparent in taps providing significant mixer efficiency that is completely controllable in biphase or sense, as well as in amplitude, in accordance with the invention.

Referring to the Appendix of mathematical relationships hereinafter, let: $E_m$ represent the mixer effect, such as that due to the electric field, observable at the tap in response to a pair of waves traveling in opposite directions beneath the tap; $S_1$ represent a signal traveling in one direction; $S_2$ represent a signal traveling in the opposite direction; and the subscript "c" denote the combined effect of the two waves. The observable mixer effect requires that relationship (1) hold true. Since the two counter-propagating waves, and their effects, sum linearly in the acoustic substrate, relationships (2)-(4) also apply. The expressions for the counter-propagating waves (as in the embodiment of FIG. 1) are set forth in relationships (5) and (6), wherein the exponential terms represent the wave variations as a function of time and distance, or, stated alternatively, the propagation effects in the waves. The first term of relationship (4) is found by squaring relationship (5) to yield relationship (7), in which the (a) term is observed to contain components at twice the original frequency (first harmonic), and the (b) term is seen to be time invariant, and not propagating. Of course, a similar expression can be written for the square of the second wave (relationship (6) squared), which is not written herein for simplicity. The final term of relationship (4), the cross product, is set forth in relationship (8), where the (a) and (b) terms represent components of waves at a frequency which is the sum of the frequencies of the two original waves, and the (c) and (d) terms represent components of waves at a frequency which is the difference between the frequencies of the two original waves. The terms of relationship (8) represent the product mixed wave components of interest herein.

Figure 3:
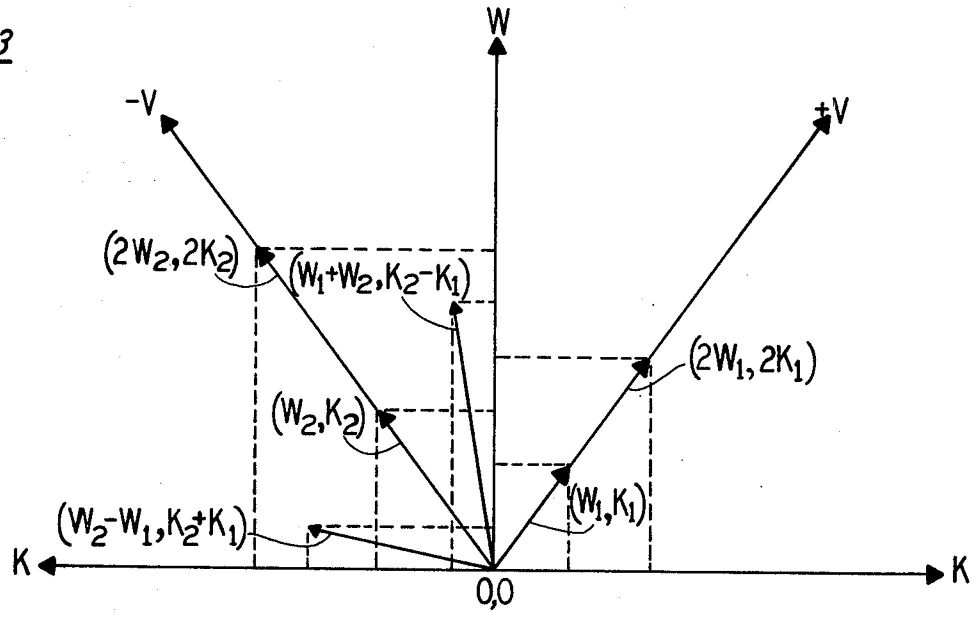
FIG. 3 is a chart illustrating the relationship between angular frequency and wavevector of propagating and non-propagating waves.

FIG. 3 is a diagram relating the wavevector to the angular frequency of the wave at the wave propagation velocity of the acoustic medium. Waves which appear strictly along the ordinate ($\omega$) are time variant equally across the entire space of the substrate, with no spatial variation. Waves along the abscissa (k, of $\pm$x) are standing waves which are constant in time but vary with distance along the substrate surface. Waves which fall on the velocity vectors (V) are traveling waves, which vary in time and in distance related to time by the velocity so as to propagate in one direction or the other, or both. All other waves on the diagram (not on the abscissa, the ordinate, nor the velocity vectors) are waves which vary in time and in space, but because these two variations are uncoordinated at the velocity of the substrate surface, they do not compose to traveling waves. In other words, the temporal and spatial effects, being uncoordinated, are sufficiently cancelling so that any tendency to propagate causes the waves to die out rapidly in time and across space. In FIG. 3, the wavevectors, k, are plotted to the right and to the left in dependence upon the direction of the related wave, to reflect the propagation direction which is accounted for in the relationship by the sign of "x". However, the addition and subtraction of them is without regard to direction, and considers only their magnitudes (the "k" values are, themselves, unsigned). Any wave generated in the surface with a proper relationship between wavevector and frequency could propagate in both directions, and could be plotted in both halves of FIG. 3.

Term (a) of relationship (7), contains terms at twice the frequency of the first wave, and there are similar components (not shown for simplicity) at twice the frequency of the second wave. However, these relate linearly in both frequency and wavevector so that they fall on the velocity vector and are propagating waves. This is an illustration of the well known degenerate effect of the first harmonic in surface acoustic waves. Term (b) of relationship (7) has no temporally or spatially varying components at all, and therefore falls on the zero, zero axis in FIG. 3, and as such represents a DC magnitude term. Similarly with respect to the concomitant portion concerning the second wave (not shown for convenience). On the other hand, terms (a) and (b) of relationship (8) have components at the sum frequency but with a wavevector equal to the difference in magnitude between wavevectors $k_1$ and $k_2$, and as such appear in the wavevector diagram off the velocity vector and are not traveling waves, even though they have variations with time and space. Similarly, terms (c) and (d) of relationship (8) have terms at the difference frequency and are related by the sum of the wavevectors so as to appear off the velocity vector, and also are not traveling waves. This means that the components at the sum and difference frequencies resulting from product mixing as a consequence of the field established by source-drain bias, in accordance with the present invention, exists locally only in the vicinity of the bias field, and may be selectively extracted by spacing of the tap elements in proper relationship with the wavevector of either the sum or the difference frequency, as is desired. The fact that the product frequency (the sum frequency or difference frequency, as selected by the design of the acoustic wave device and selection of frequencies) exists only locally, and varies uniquely from tap to tap, without any significant propagation between taps, is an important aspect of the present invention. It is believed that this provides a significant signal at the tap of interest, with little intertap interference, reflections and the like. The mixer effect, being local, is inherently isolative, and avoids the necessity for certain intertap isolation networks known in the art.

As described briefly hereinbefore, the result of product mixing of two waves yields many components. The sum frequency component has, as is shown in terms (a) and (b) of relationship (8), a wavevector equal to the difference in the magnitude of the wavevectors associated with the two mixed frequencies, and the difference frequency component has, as illustrated in terms (c) and (d) of relationship (8), a wavevector which is the sum of the magnitudes of the wavevectors of the original, intermixed waves. Selection of either the sum or the difference frequency component is achieved by matching the tap configuration to the wavevector, $k_3$, for the selected component (either the sum frequency or the difference frequency), as shown in relationships (9) and (10).

For any wave propagating in the medium, there is a wavelength, $\lambda$, related to the frequency of the wave by the velocity of waves in that medium such that $V=f\lambda$. Even if a wave is not propagating in the medium, there will be a spatial periodicity to the wave, but unrelated to the frequency of the wave by the velocity of the medium, and instead created by the interaction of the input waves. To emphasize the fact that the result of product mixing produces waves which are not propagating at the velocity of the medium, the spatial periodicity of such waves $\Lambda_3$ is referred to herein as charge periodicity and is defined in relationship (11). By substituting relationships (9) and (10) into relationship (11), it can be seen that the charge periodicity varies directly with frequency as set forth in relationships (12) and (13), respectively. Therefore, unlike individual waves in which the wavelength is inversely related to the frequency by velocity of the medium, in the present case of product mixing within the surface, as a direct result of wave interaction between two propagating waves (such as the signal and carrier waves in the example herein), the periodicity $\Lambda_3$ is determined by the interaction of those waves, rather than by propagation of an oscillatory electric wave through a medium having a defining velocity.

To select either the sum or the difference frequency, therefore, one may select either a large or a small tap element spacing commensurate with the charge periodicity $\Lambda_3$ determined from relationships (9) through (13). The choice of whether the device is designed for sum or difference frequency operation depends on several considerations including the relative strength of the two components, the system bandwidth, the capability for filtering out spurious frequency components, and the ease of tap fabrication. For counter-propagating waves (as in the embodiment illustrated in FIG. 1 and the example of the relationships in the Appendix), relationships (12) and (13) illustrate that the spatial tap periodicity for sum frequency operation may be considerably larger than that for difference frequency operation. On the other hand, when the waves are co-propagating (due to the fact that both the incoming signal and the CW carrier are launched from the same end of the SAW device) the signs of the kx terms in relationships (5) and (6) are then all the same, so that the situation is reversed, and the greater tolerance in tap spacing would be achieved by using the difference frequency.

Figure 4:
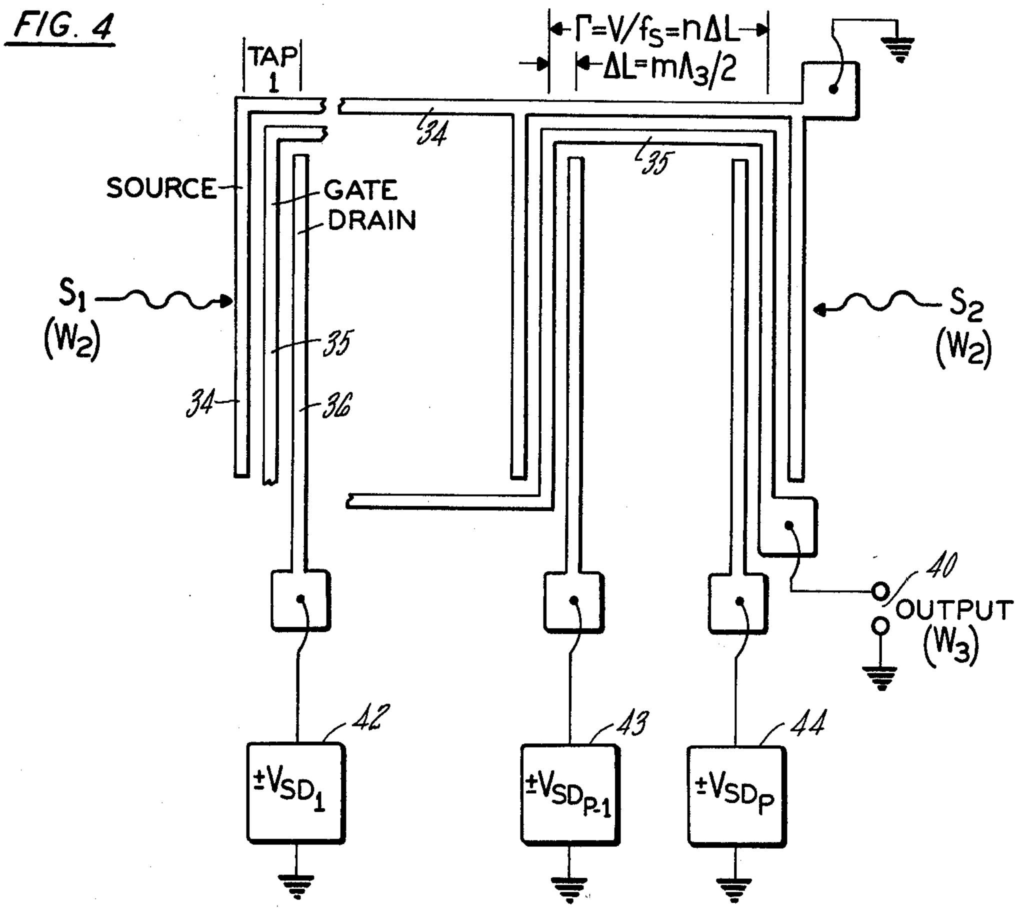
FIGS. 4–6 are simplified plan views of common gate FET tap structure which may be incorporated into the SAW signal processor illustrated in FIG. 1, in accordance with the invention.
Figure 5:
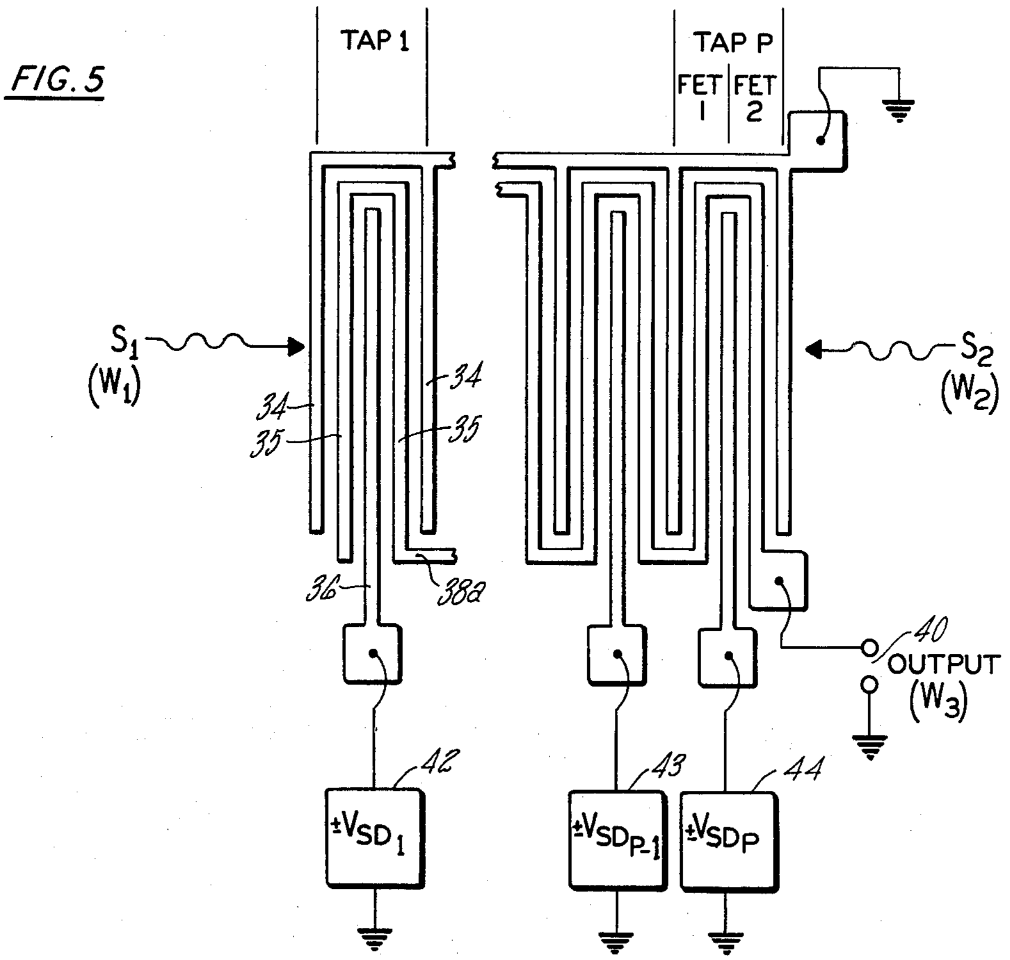
Figure 6:
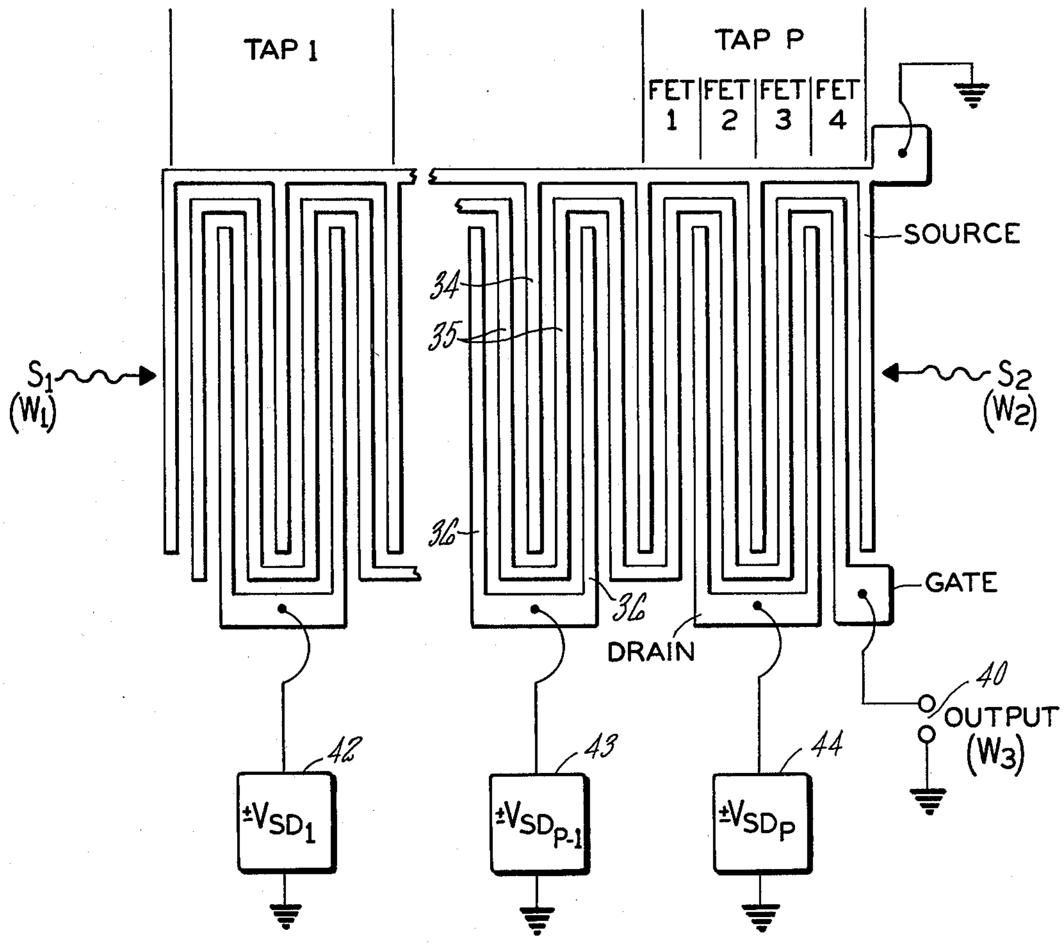

Various forms of FET taps in accordance with a biphase embodiment of the present invention are illustrated in more detail (with the remainder of the SAW signal processor omitted for simplicity) in FIGS. 4–6. In addition, the configuration of FIG. 4 illustrates that the gates 35 of the successive taps may be connected directly on the substrate for maximum sensitivity to the selected sum or difference frequency. The increased number of FETS per tap in FIGS. 5 and 6 reduce the conversion losses of the processor.

In the example herein, of an amplitude and biphase programmable PSK transversal matched filter, the tap interaction region geometry is selected so as to match the chip rate of the signal to be analyzed (from source 26) and the wavevector of selected sum or difference frequency, which results from product mixing controlled by the tap program, so as to correlate the incoming signal with the program of source-drain bias (both in amplitude and in polarity or biphase) established for the respective taps. The spacing between the gate 35 and the drain 36 should be an odd number of half periods of the charge periodicity, $\Delta L = m\Lambda_3/2$ (FIG. 4).

For correlation of PSK coded signals, the various taps must be spaced one from another so as to achieve the same spacing on the surface as the spacing of the chips of coding in the signal to be correlated. For instance, if there is a 100 MHz signal carrier, the phase of which is altered every 10 Hz, then the signal would have a 10 MHz sampling rate or sampling frequency. In the substrate, the spacing of the chips of alternating phase is determined by the velocity of the wave in the substrate, V, divided by the chip rate, or: $\Lambda_s = V/f_s$. In order to sample each chip contemporaneously it is necessary to have at least one tap corresponding to each of the code chips, and therefore the intertap spacing $\Gamma = V/f_s$. And, for equi-phase, coherent detecting of all of the chips for a meaningful summation of the detection of the product mixer result (as an indication, for instance, of correlation between the incoming signal chips and the coding of the taps), the intertap spacing shoudl be an integral number of charge half-periods, such that $\Gamma = V/f_s = n\Delta L$. In the generalized configurations of FIGS. 1 and 4, even in the case where m=1, n must be at least 2 in order to be practically realizable. On the other hand, the embodiment illustrated in FIG. 5 utilizes each source (except the end source fingers) and each drain for two different FETs, each tap consisting of two FETs, comprised of equally spaced and dimensioned fingers. In this case, each of the gate segments must be an odd number of half wavelengths from the related drain. And, the intertap spacing for equally sized and spaced tap fingers is $4\Delta L$. In such a case, the tap geometry then becomes related back to the original carrier frequencies of the two input signals by the relationship between the gate-drain spacing and the intertap spacing and the factors set forth in relationships (9)-(13) in the Appendix, as is derived briefly in relationships (14)-(19).

The embodiment of FIG. 5 has, for each drain, a gate segment which is on the opposite side of the drain, and would therefore appear to be phase reversed with respect to that drain, insofar as the two gate segments are concerned. However, the E field created under each of the gate segments is also reversed, meaning that the effect in the gate as a consequence of product mixing induced and controlled by the sense and magnitude of the E field will come out to be the same, and therefore be additive in each tap.

A similar embodiment is illustrated in FIG. 6 in which each tap includes four FETs by virtue of each drain having two segments instead of the single segment illustrated in FIGS. 1, 4 and 5. Although the constants (n, m) will differ, operation is the same in the embodiment of FIG. 6 as that described hereinbefore with respect to FIG. 5, and relationships (16)-(19) similarly apply.

As a specific example of parameters for the embodiment of FIG. 6, consider operation with an input signal which is phase shift keyed on a carrier frequency $f_1$ of 100 MHz, with a chip rate or sampling frequency $f_s$ of 10 MHz; n=2 and $m=1$. The required frequency, $f_2$, of the local oscillator carrier is then found from relationship (17) as $f_2 = f_1 + 2f_s = 140$ MHz, for selection of $f_3$ = the sum frequency. Considering acoustic waves propagating in the (011) direction on a (100) gallium arsenide surface, $v = 2.88 \times 10^5$ cm/sec, and the fundamental electrode period $\Delta L = 144$ microns. For equal finger widths and spacings in each of the taps, the required finger width $\Delta L/8 = 18$ microns, which is a reasonable fabrication requirement. The output frequency, $f_3 = 240$ MHz, lies midway between the second harmonic frequencies of the input waves, thus permitting band pass filtering of the correlation output. Other operating frequencies and characteristics may be chosen; for instance, an input signal carrier of 300 MHz with tap sampling frequency of 30 MHz also lies within reasonable device design and fabrication capabilities.

Figure 7:
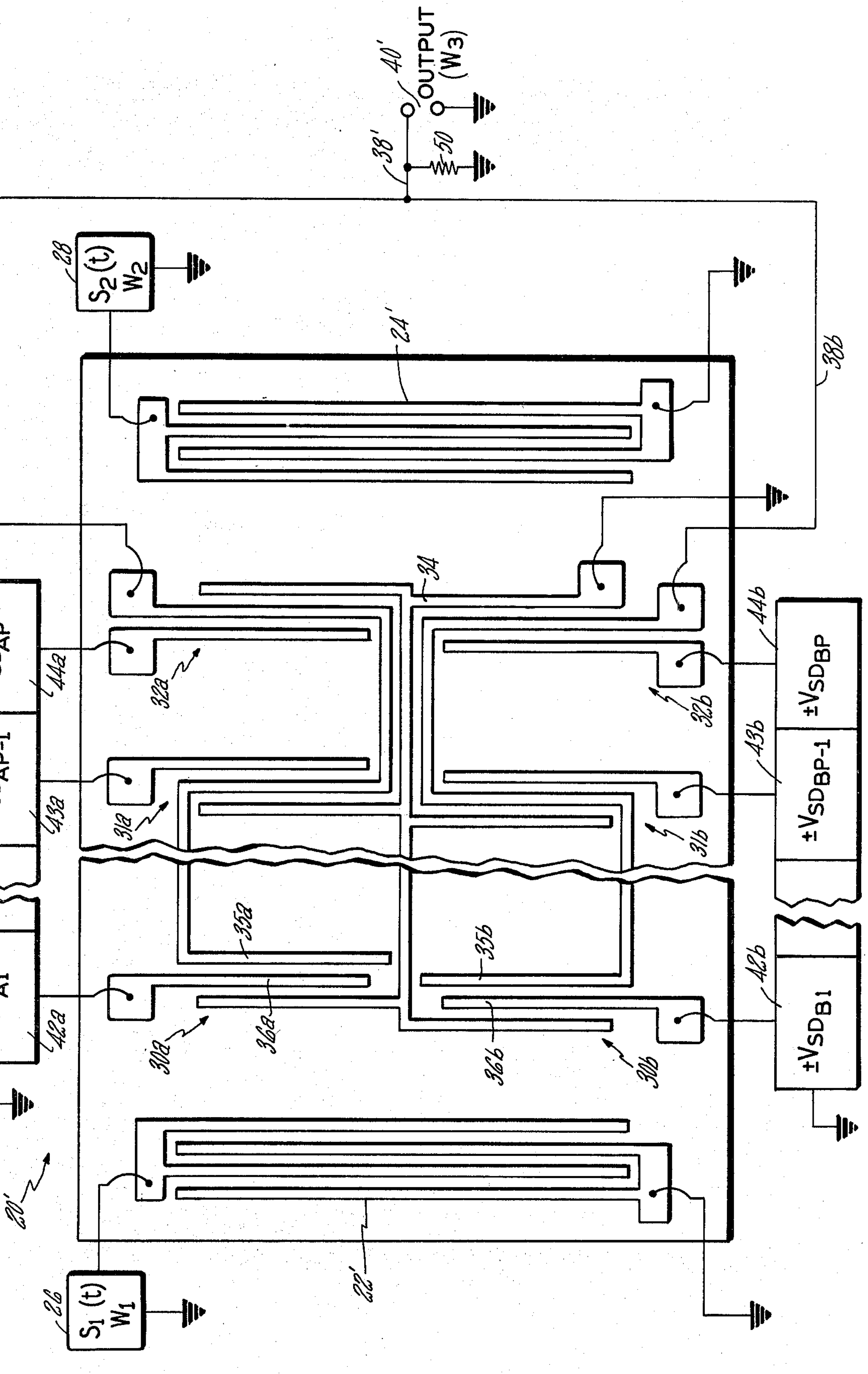
FIG. 7 is a simplified plan view of alternative tap structure which may be incorporated into the SAW signal processor illustrated in FIG. 1, to allow full phase control, in accordance with the invention.
Figure 7:
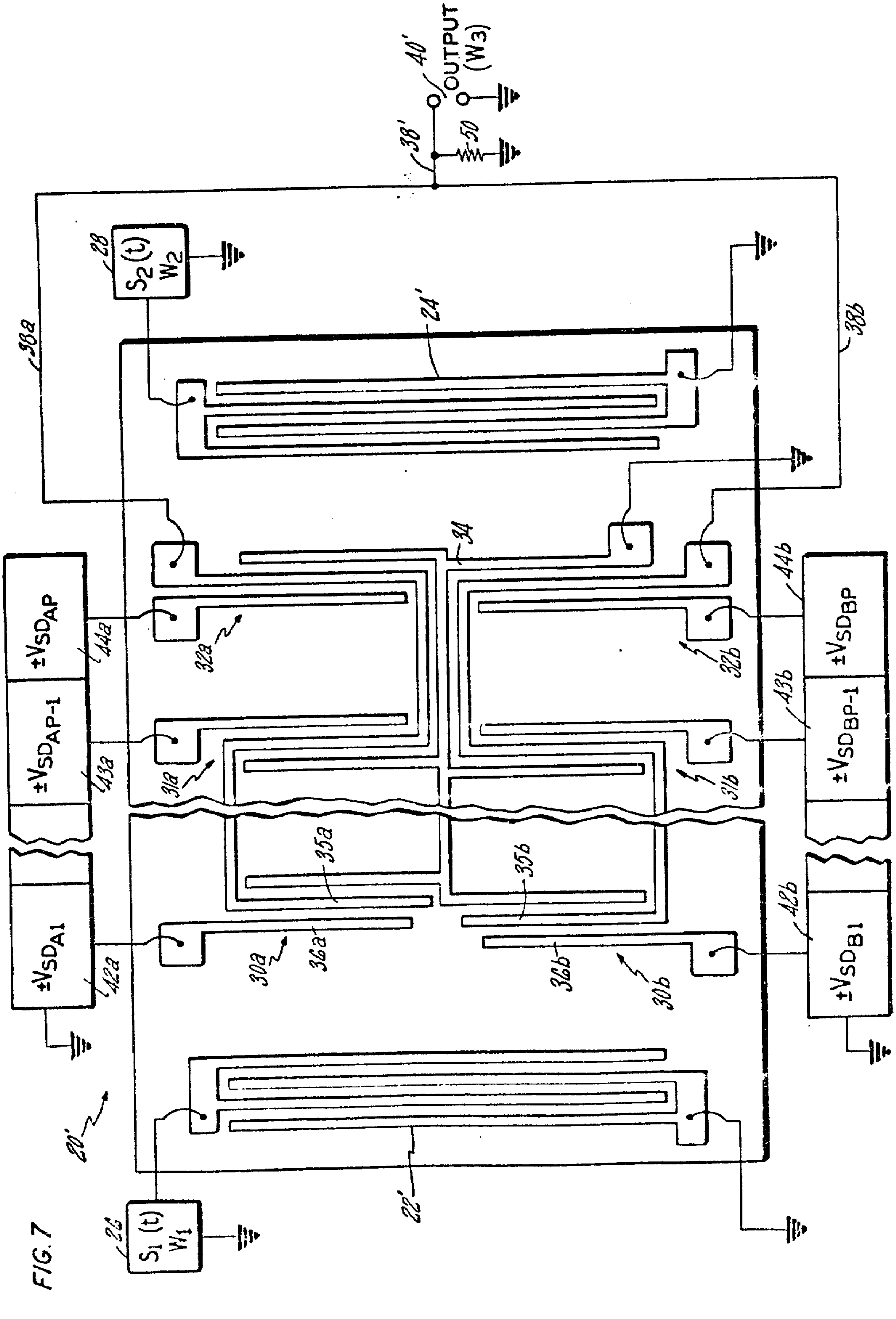

In FIG. 7, a further embodiment of the invention comprises a saw signal processor 20′ having two sets of biphase and amplitude programmable taps, the components of which are respectively designated by reference numerals utilized in FIG. 1 further characterized by "a" and "b" to delineate the separate sets, or the separate taps related to each pair. In this case, the launching transducers 22′, 24′ must be broad enough to satisfy wave propagation for both sets of taps.

The embodiment of FIG. 7 extends the capability of biphase and amplitude programming of internal mixing to completely variable phase and amplitude programming of internal mixing. This is accomplished by providing suitable phase selection and amplitude weighting for each tap in each related pair (such as the pair 30*a*, 30*b*) so that the summation of the output effects of that pair can match any phase ($0-2\pi$) of the related chip of the incoming wave from the source 26. Because of the isolation inherently provided by the independent mixer action of each tap, the output of the related pairs of tap sets may conveniently be summed in a simple fashion, such as across a resistive load 50, for example. On the other hand, if further amplification, isolation and/or filtering is desired in the output, it may be utilized in accordance with techniques known in the art.

The programming of the biphase and amplitude mixer effects by means of the source-drain biases 42*a*-44*a*, 42*b*-44*b*, may be accomplished in the manner described in Grudkowski, T. W., et al, Programmable Transversal Filter Using Nonlinear Tapped Delay Lines, IEEE 1977 Ultrasonics Symposium Proceedings, pp 710-714. However, the fixed phase shifting denoted in the aforementioned article is achieved externally, whereas the fixed phase shift is achieved herein by having the corresponding elements of the taps 30*a*-32*a*displaced on the substrate from the corresponding elements of the taps 30*b*-32*b* by a distance equal to the desired phase shift (eg 90°) at $\omega_3$, when operating under the desired parameters. This spacing may be achieved in accordance with the principles discussed in connection with the Appendix of Relationships, hereinbefore.

Although the embodiment disclosed herein show the use of counter-propagating waves by virtue of the fact that the transducers 22, 24; 22′, 24′ are disposed on opposite sides of the tapped interaction region, it should be understood that parallel waves may be employed as in the Reeder patent, and that co-propagating waves may be utilized by having the launching transducers disposed at the same side of the tapped interaction region, as is known in the art. The embodiments described herein include gates which are connected together for correlative summation of the components of product mixing of the various taps. As such, these embodiments comprise equi-spaced, phase and amplitude programmable, general transversal filters useful in signal processing of the types described hereinbefore, and otherwise as is known in the art. The choice of the input signals is a function of the use to which the present invention is to be put. For phase and amplitude programmable, matched transversal filter signal correlation, one of the input signals would be the phase and/or amplitude coded signal of interest, and the other input signal would simply be a local oscillator carrier to facilitate product mixing. In such applications, the local oscillator may be controlled in response to the input signal carrier, to compensate for shifts therein; or other linear shifts along the delay line (such as due to temperature variation) may be compensated by adjustment of the local oscillator carrier, as described in the aforementioned Grudkowski et al article. For other applications, other input signal choices would necessarily be made. For instance, discrete Fourier transformation of a discretely coded signal applied as amplitude coding through the source-drain biases would utilize chirp input signals at the launching trasnducers. Similarly, the techniques of utilizing the present invention as a general, phase and amplitude programmable, transversal filter are known. The invention may also be used with independent gate outputs, by not connecting the outputs together as shown in FIG. 1 (or as fabricated in FIGS. 4–7). Instead, each gate output could be used independently to suit any form of sophisticated signal processing which may be desired. Although a particular, known useful example of independent gate output utilization may not presently be apparent, it is to be understood that the present invention is intended for a number of uses which may not at present be apparent, but which the application of this invention will bring forth.

As described briefly hereinbefore, devices in accordance with the present invention may be fabricated using surface acoustic wave interdigital transducer technology, gallium arsenide processing technology, field effect transistor processing technology, thin film technology, and the like, all of which are known in the art. The invention may also be practiced by fabricating the FET taps in any suitable configuration on a semiconductive silicon surface, and overlaying the FET taps with a zinc oxide film to provide the medium for the acousto-electric waves. The ZnO-Si film technology is known and is well documented in the art. Other piezoelectric and semiconductive substrates may be chosen. The particular choice of materials, design, and fabrication techniques are left to those skilled in the art, in dependence upon the particular utilization to which the invention is to be put, and other factors. So long as each tap consists of at least one rectifying finger dispersed between two ohmic fingers, on a semiconducting substrate in which two electroacoustic waves are propagating, and the taps are individually biasable to established a program of phase and/or amplitude controlled mixer efficiency, the invention may be practiced. Similarly, although the invention is shown and described with respect to exemplary embodiments thereof, it should be understood by those skilled in the art that the foregoing and various other changes, omissions and additions may be made therein and thereto, without departing from the spirit and the scope of the invention.

APPENDIX $$E_m \propto S_c^2 \quad (1)$$

$$S_c = S_1 + S_2 \quad (2)$$

$$S_c^2 = (S_1 + S_2)^2 \quad (3)$$

APPENDIX-continued $$S_t^2 = S_1^2 + S_2^2 + 2S_1S_2 \quad (4)$$

$$S_1 = \tfrac{1}{2}[\hat{S}_1 e^{j(\omega 1t - k1x)} + \hat{S}_1^* e^{-j(\omega 1t - k1x)}] \quad (5)$$

$$S_2 = \tfrac{1}{2}[\hat{S}_2 e^{j(\omega 2t + k2x)} + \hat{S}_2^* e^{-j(\omega 2t + k2x)}] \quad (6)$$

$$S_1^2 = \tfrac{1}{4}[\hat{S}_1\hat{S}_1 e^{j(2\omega 1t - 2k1x)} + \hat{S}_1^*\hat{S}_1^* e^{-j(2\omega 1t - 2k1x)} + \quad (7a)$$
$$\hat{S}_1\hat{S}_1 + \hat{S}_1^*\hat{S}_1^*] \quad (b)$$

$$2S_1S_2 = \tfrac{1}{2}[\hat{S}_1\hat{S}_2 e^{j\{(\omega 1+\omega 2)t+(k2-k1)x\}} + \quad (8a)$$
$$\hat{S}_1^*\hat{S}_2^* e^{-j\{(\omega 1+\omega 2)t+(k2-k1)x\}} + \quad (b)$$
$$\hat{S}_1\hat{S}_2^* e^{-j\{(\omega 2-\omega 1)t+(k2+k1)x\}} + \quad (c)$$
$$\hat{S}_1^*\hat{S}_2 e^{j\{(\omega 2-\omega 1)t+(k2+k1)x\}}] \quad (d)$$

for sum frequency: $k_3^+ = k_2 - k_1$ (9)

for difference frequency: $k_3^- = k_2 + k_1$ (10)
Where $k_1 = V/f_1$; $k_2 = V/f_2$ $$\Lambda_3 = 2\pi/k_3 \quad (11)$$

$$\Lambda_3^+ = \frac{\lambda_1\lambda_2}{\lambda_1 - \lambda_2} \quad (12)$$

$$\Lambda_3^- = \frac{\lambda_1\lambda_2}{\lambda_1 + \lambda_2} \quad (13)$$

for sum, (9) and (11) yield: $\Lambda_3^+ = \dfrac{2\pi}{\frac{2\pi}{V}(f_2 - f_1)}$ (14)

$$\Gamma = V/f_s^+ = nm\Lambda_3^+ = nmV/f_2 - f_1) \quad (15)$$

so $f_s^+ = (f_2 - f_1)/nm$ (16)

or, $f_2^+ = nmf_s + f_1$ (17)

similarly, for difference, $f_s^- = (f_2 + f_1)/nm$ (18)

$$f_2^- = nmf_s - f_1 \quad (19)$$

Having thus described typical embodiments of our invention, that which we claim as new and desire to secure by Letters Patent of the United States is:

1. A surface acoustic wave signal processor employing programmable internal product mixer efficiency, comprising:
   - a piezoelectric and semiconductive substrate;
   - means for launching a pair of acousto-electric waves in said substrate along a propagation path adjacent to a surface of said substrate;
   - a plurality of taps disposed on said surface along said propagation path, each of said taps including at least one drain electrode having an ohmic contact with said substrate, the drain electrodes of each tap being isolated from the drain electrodes of the other taps, at least one gate electrode having a rectifying contact with said substrate, and at least one source electrode having an ohmic contact with said substrate, the source electrodes of all the taps being connected together;
   - programmable means for separately providing to each of said taps a source-drain bias between the drain of the corresponding one of said taps and said common source, said programmable means providing bias to each tap of amplitude and polarity to respectively control the amplitude and phase of the mixer efficiency of nonlinear product mixing of said waves in the region of said substrate contiguous with such tap; and
   - means associated with said gate electrodes for extracting from each of said taps a component of product mixing occurring at such tap.

2. A surface acoustic wave phase and amplitude programmable transversal filter employing programmable internal product mixer efficiency, comprising:

a piezoelectric and semiconductive substrate;

means for launching a pair of acousto-electric waves in said substrate along a propagation path adjacent to a surface of said substrate;

a plurality of taps disposed on said surface along said propagation path, each of said taps including at least one drain electrode having an ohmic contact with said substrate, the drain electrodes of each tap being isolated from the drain electrodes of the other taps, at least one gate electrode having a rectifying contact with said substrate, the gate electrodes of all the taps being connected together to provide an output signal, and at least one source electrode having an ohmic contact with said substrate, the source electrodes of the taps being connected together; and programmable means for separately providing to each of said taps a source-drain bias between the drain of the corresponding one of said taps and said common source, said programmable means providing bias to each tap of amplitude and polarity to respectively control the amplitude and phase of the mixer efficiency of nonlinear product mixing of said waves in the region of said substrate contiguous with such tap.

3. A surface acoustic wave signal processor employing internal product mixer efficiency which is programmably variable in phase through 2π radius, comprising:

a piezoelectric and semiconductive substrate;

means for launching a pair of acousto-electric waves in said substrate along a propagation path adjacent to a surface of said substrate;

a plurality of taps disposed on said surface along said propagation path, each of said taps including at least one drain electrode having an ohmic contact with said substrate, the drain electrodes of each tap being isolated from the drain electrodes of the other taps, at least one gate electrode having a rectifying contact with said substrate, and at least one source electrode having an ohmic contact with said substrate, the source electrodes of the taps being connected together, said taps being arranged in two sets, each set having a tap corresponding to a related tap in the other set to form a pair, each tap being disposed on said surface at a different distance from one of said launching means than the tap of the related pair to provide a fixed phase difference between the taps of each pair with respect to a component of product mixing from said taps;

means associated with said gate electrodes for summing the components of product mixing occurring at each tap with the components of product mixing occurring at the corresponding tap of each pair; and programmable means for separately providing to each of said taps a source-drain bias between the drain of the corresponding one of said taps and said common source, said programmable means providing bias to each tap of amplitude and polarity to respectively control, in amplitude and biphase, the mixer efficiency of nonlinear product mixing of said waves in the region of said substrate contiguous with such tap for a desired relationship between the summed components of product mixing from each of said pairs of taps with respect to one of the waves launched by said launching means.

* * * * *

UNITED STATES PATENT AND TRADEMARK OFFICE

CERTIFICATE OF CORRECTION

PATENT NO. : 4,207,546 Page 1 of 2

DATED : June 10, 1980

INVENTOR(S) : Thomas W. Grudkowski

It is certified that error appears in the above—identified patent and that said Letters Patent is hereby corrected as shown below:

FIGURE 7 should appear as shown on the attached sheet.

Signed and Sealed this

*Thirteenth* Day of *April 1982*

[SEAL]

*Attest:*

GERALD J. MOSSINGHOFF

*Attesting Officer* *Commissioner of Patents and Trademarks*